United States Patent
Yap et al.

(10) Patent No.: US 8,733,280 B2
(45) Date of Patent: May 27, 2014

(54) SHOWERHEAD FOR PROCESSING CHAMBER

(75) Inventors: Lipyeow Yap, Sunnyvale, CA (US); Jay DeDontney, Prunedale, CA (US); Shouqian Shao, Fremont, CA (US); Jason Wright, Saratoga, CA (US)

(73) Assignee: Intermolecular, Inc., San Jose, CA (US)

( * ) Notice: Subject to any disclaimer, the term of this patent is extended or adjusted under 35 U.S.C. 154(b) by 686 days.

(21) Appl. No.: 12/973,845

(22) Filed: Dec. 20, 2010

(65) Prior Publication Data

US 2012/0156877 A1    Jun. 21, 2012

(51) Int. Cl.
*C23C 16/455* (2006.01)
*C23C 16/505* (2006.01)
*H01L 21/3065* (2006.01)

(52) U.S. Cl.
CPC ............ *C23C 16/45565* (2013.01)
USPC ............ 118/723 E; 118/715; 118/723 R; 156/345.1; 156/345.37; 156/345.34; 438/689; 438/758

(58) Field of Classification Search
CPC .... C23C 16/0272; C23C 16/04; C23C 16/28; C23C 16/45563; C23C 16/45565; C23C 16/45574; C23C 16/45576; C23C 16/45578; C23C 16/45595; C23C 16/45568; C23C 16/4557; C23C 16/45572; H01L 21/02274; H01L 21/0228; H01L 21/02337; H01L 21/0234; H01L 21/28194; H01L 21/28229; H01L 21/285; H01L 21/32051; H01J 37/32532

USPC ............ 118/723 R, 723 E, 715; 156/345.37, 156/345.1, 345.34; 438/689, 759
See application file for complete search history.

(56) References Cited

U.S. PATENT DOCUMENTS

| | | | | |
|---|---|---|---|---|
| 5,565,071 A | * | 10/1996 | Demaray et al. | 204/192.12 |
| 2004/0082251 A1 | * | 4/2004 | Bach et al. | 445/60 |
| 2005/0241766 A1 | * | 11/2005 | Dhindsa et al. | 156/345.34 |
| 2009/0081878 A1 | * | 3/2009 | Dhindsa | 438/729 |
| 2009/0179085 A1 | * | 7/2009 | Carducci et al. | 239/289 |
| 2010/0167551 A1 | * | 7/2010 | DeDontney | 438/758 |
| 2010/0243165 A1 | * | 9/2010 | Um | 156/345.34 |
| 2011/0070740 A1 | * | 3/2011 | Bettencourt et al. | 438/710 |

FOREIGN PATENT DOCUMENTS

JP    2001-085398    *    3/2001

* cited by examiner

*Primary Examiner* — Jeffrie R Lund
*Assistant Examiner* — Satish Chandra

(57) ABSTRACT

A top assembly for a processing chamber having a back plate and a hub is provided. The back plate has a first portion and a second portion. The first portion is connected to the second portion through a central region of the back plate, wherein a gap is defined between opposing surfaces of the first and second portions outside the central region. The first portion includes an embedded heating element. The hub is affixed to a top surface of the second portion of the back plate over the central region. The hub has a top surface with a plurality of channel openings defined within a central region of the hub and a bottom surface having a central extension with a plurality of channels defined therethrough. The bottom surface includes an annular extension spaced apart from the central extension.

15 Claims, 7 Drawing Sheets

SHOWERHEAD FOR PROCESSING CHAMBER

This invention is based on research sponsored by DARPA/Defense Microelectronics Activity (DMEA) under agreement number H94003-10-2-1003. The United States Government has certain rights to this invention and is authorized to reproduce and distribute reprints for Government purposes, notwithstanding any copyright notation thereon.

BACKGROUND

Combinatorial processing enables rapid evaluation of semiconductor processing operations. The systems supporting the combinatorial processing are flexible to accommodate the demands for running the different processes either in parallel, serial or some combination of the two.

Some exemplary semiconductor processing operations includes operations for adding (depositions) and removing layers (etch), defining features, preparing layers (e.g., cleans), doping, etc. Similar processing techniques apply to the manufacture of integrated circuit (IC) semiconductor devices, flat panel displays, optoelectronics devices, data storage devices, magneto electronic devices, magneto optic devices, packaged devices, and the like. As feature sizes continue to shrink, improvements, whether in materials, unit processes, or process sequences, are continually being sought for the deposition processes. However, semiconductor companies conduct research and development (R&D) on full wafer processing through the use of split lots, as the deposition systems are designed to support this processing scheme. This approach has resulted in ever escalating R&D costs and the inability to conduct extensive experimentation in a timely and cost effective manner. Combinatorial processing as applied to semiconductor manufacturing operations enables multiple experiments to be performed on a single substrate. Equipment for performing the combinatorial processing must support the efficiency offered through the combinatorial processing operations.

It is within this context that the invention arises.

BRIEF DESCRIPTION OF THE DRAWINGS

The invention, together with further advantages thereof, may best be understood by reference to the following description taken in conjunction with the accompanying drawings.

SUMMARY

Figure 1A:
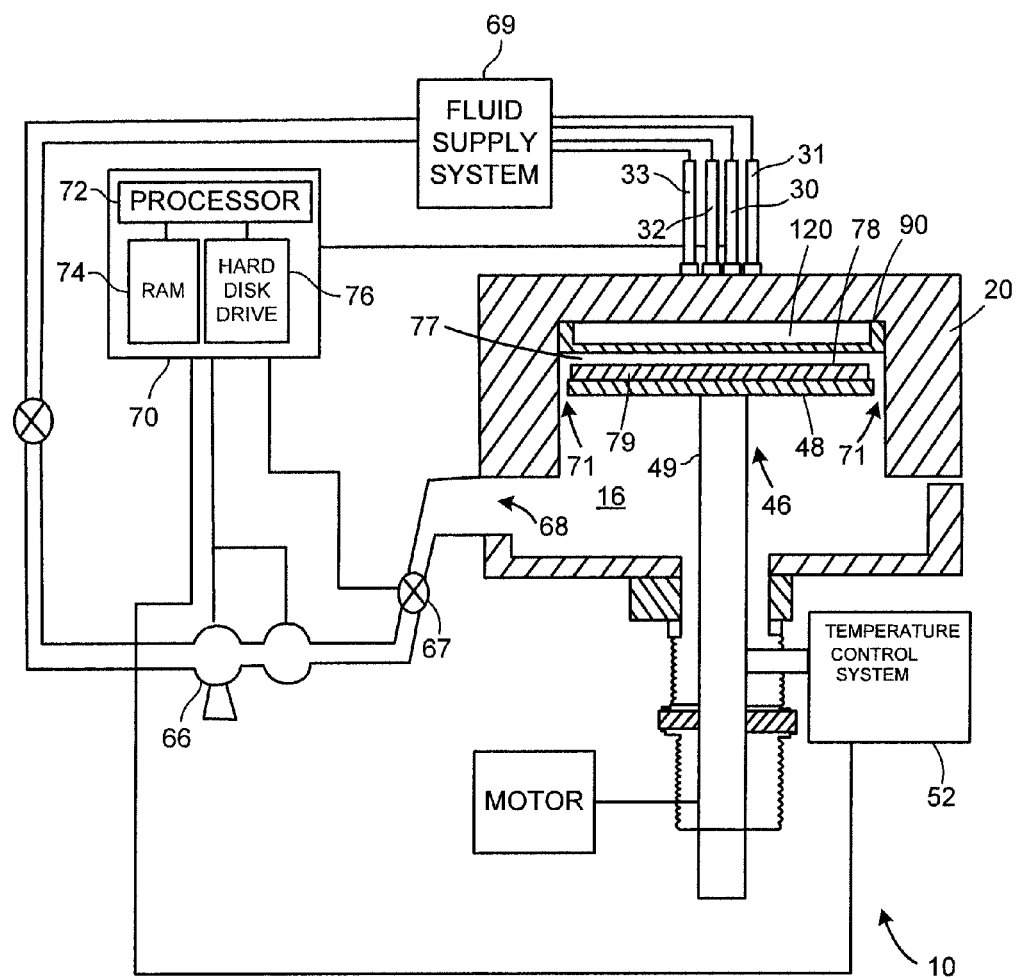
FIG. 1A is a representation of an exemplary substrate processing system in accordance with one embodiment of the present invention.

Embodiments of the present invention provide a chamber top assembly configuration that is capable of being utilized for both high temperature and low temperature deposition processing operations. Several inventive embodiments of the present invention are described below.

In one aspect of the invention, a top assembly for a processing chamber having a back plate and a hub is provided. The back plate has a first portion and a second portion. The first portion is connected to the second portion through a central region of the back plate, wherein a gap is defined between opposing surfaces of the first and second portions outside the central region. The first portion includes an embedded heating element. The hub is affixed to a top surface of the second portion of the back plate over the central region. The hub has a top surface with a plurality of channel openings defined within a central region of the hub and a bottom surface having a central extension with a plurality of channels defined therethrough. One such embodiment of the bottom surface includes an optional annular extension spaced apart from the central extension, which can also be removed altogether to further minimize contact. In another embodiment, a showerhead is affixed to a bottom surface of the first portion of the back plate. Fluid channels extend from the top surface of the hub through the central extension to corresponding fluid channels defined through the first portion, the second portion and the central region of the back plate.

In another aspect of the invention, a method for maintaining a substantially constant temperature across a showerhead during a semiconductor manufacturing process is provided. The method initiates with flowing a process fluid from a fluid source to a fluid channel defined through a hub and a back plate, the back plate affixed to the showerhead. While flowing the process fluid the method includes, heating a first zone of the back plate through a first embedded heater of the back plate, where the first zone defined within a central region surrounding the fluid channel within the back plate; and heating a second zone of the back plate through a second embedded heater of the back plate, the second zone defined along an outer periphery of the back plate. The process fluid flows through the showerhead and into a processing region of the processing chamber.

Other aspects of the invention will become apparent from the following detailed description, taken in conjunction with the accompanying drawings, illustrating by way of example the principles of the invention.

DETAILED DESCRIPTION

The embodiments described herein provide for a High Productivity Combinatorial (HPC) method and apparatus enabling combinatorial processing for Chemical Vapor Deposition (CVD) and Plasma Enhanced Chemical Vapor Deposition (PECVD) operations. In one embodiment, a showerhead compatible with a wide range of processing temperatures is provided. In one embodiment, the CVD process is performed on a substrate in a combinatorial fashion so various regions of the substrate are processed differently. These regions are then tested to determine the effectiveness of the CVD process. It will be apparent, however, to one skilled in the art, that the present invention may be practiced without some or all of these specific details. In other instances, well known process operations have not been described in detail in order not to unnecessarily obscure the present invention.

The embodiments described below further provide details for a multi-region processing system and associated showerhead that enable processing a substrate in a combinatorial fashion. Thus, different regions of the substrate may have different properties, which may be due to variations of the materials, unit processes (e.g., processing conditions or parameters) and process sequences, etc. For some embodiments, within each region the conditions are preferably substantially uniform so as to mimic conventional full wafer processing within each region. However, useful results can be obtained for certain experiments without this requirement. In one embodiment, the different regions are isolated so that there is no inter-diffusion between the different regions.

In addition, the combinatorial processing of the substrate may be combined with conventional processing techniques where substantially the entire substrate is uniformly processed (e.g., subjected to the same materials, unit processes and process sequences). Thus, the embodiments described herein can pull a substrate from a manufacturing process flow, perform combinatorial processing and return the substrate to the manufacturing process flow for further processing. Alternatively, the substrate can be processed in an integrated tool that allows both combinatorial and conventional processing in various chambers attached around a central chamber or within a R&D facility such as a clean room. Consequently, in one substrate, information concerning the varied processes and the interaction of the varied processes with conventional processes can be evaluated. Accordingly, a multitude of data is available from a single substrate for a desired process.

The embodiments described herein enable the application of combinatorial techniques for process sequence integration of semiconductor manufacturing operations. Combinatorial processing applied to semiconductor manufacturing operations assists in arriving at a globally optimal sequence of semiconductor manufacturing operations by considering interaction effects between the unit manufacturing operations, the process sequence of the unit manufacturing operations, the process conditions used to effect such unit manufacturing operations, as well as materials characteristics of components utilized within the unit manufacturing operations. The embodiments described below provide details for a multi-region processing system and associated reaction chambers that enable processing a substrate in a combinatorial fashion. In one embodiment, the different regions are isolated (e.g., "site-isolated") so that there is no interdiffusion between the different regions.

The embodiments are capable of analyzing a portion or subset of the overall process sequence used to manufacture semiconductor devices. Once the subset of the process sequence is identified for analysis, combinatorial process sequence integration testing is performed to optimize the materials, unit processes, and process sequences used to build that portion of the device or structure. According to some embodiments described herein, the processing may take place over structures formed on the semiconductor substrate, which are equivalent to the structures formed during actual production of the semiconductor device. For example, structures may include, but not be limited to, trenches, vias, interconnect lines, capping layers, masking layers, diodes, memory elements, gate stacks, transistors, or any other series of layers or unit processes that create a structure found on semiconductor chips.

In some embodiments, while the combinatorial processing varies certain materials, unit processes, or process sequences, the composition or thickness of the layers or structures, or the action of the unit process is substantially uniform for each region. It should be noted that the process can be varied between regions, for example, a thickness of a layer is varied or one of various process parameters or conditions, such as a voltage, flow rate, etc., may be varied between regions, as desired by the design of the experiment. The result is a series of regions on the substrate that contains structures or unit process sequences that have been uniformly applied within that region and, as applicable, across different regions. This process uniformity allows comparison of the properties within and across the different regions such that variations and test results are due to the parameter being modified, e.g., materials, unit processes, unit process parameters, or process sequences, and not the lack of process uniformity. In essence, the combinatorial processing performs semiconductor manufacturing operations on multiple regions of a substrate so that the multiple regions are processed differently to achieve different results.

FIG. 1A is a representation of an exemplary substrate processing system 10 in accordance with one embodiment of the present invention. The substrate processing system 10 includes an enclosure that is formed from a process-compatible material that for simplicity and clarity is not shown. A processing chamber 16 and a vacuum lid assembly 20 cover an opening to processing chamber 16 and are located within the enclosure. Mounted to vacuum lid assembly 20 is a process fluid injection assembly that delivers reactive and carrier fluids into processing chamber 16. The fluid injection assembly includes a plurality of passageways 30, 31, 32 and 33 to showerhead 90. The vacuum lid assembly 20, back plate 120, and showerhead 90 may be maintained within desired temperature ranges in a manner as described in more detail below. It should be appreciated that the Figures provided herein are illustrative and not necessarily drawn to scale.

A heater/lift assembly 46 is disposed within processing chamber 16. Heater/lift assembly 46 includes a support pedestal 48 connected to a support shaft 49. Support pedestal 48 is positioned between shaft 49 and vacuum lid assembly 20. Support pedestal 48 may be formed from any process-compatible material, including aluminum nitride and aluminum oxide ($Al_2O_3$ or alumina) and is configured to hold a substrate thereon, e.g., support pedestal 48 may be a vacuum chuck or utilize other conventional techniques such as an electrostatic chuck (ESC) or physical clamping mechanisms. Heater lift assembly 46 is adapted to be controllably moved so as to vary the distance between support pedestal 48 and the showerhead 90 to control the substrate to showerhead spacing. A sensor (not shown) provides information concerning the position of support pedestal 48 within processing chamber 16. Support pedestal 48 can be used to heat the substrate through the use of heating elements (not shown) such as resistive heating elements embedded in the pedestal assembly.

A fluid supply system 69 is in fluid communication with passageways 30, 31, 32 and 33 through a sequence of conduits. Flows of processing fluids, from fluid supply system 69, within processing chamber 16 are provided, in part, by a pressure control system that may include one or more pumps, such as turbo pump 64 and roughing pump 66 both of which are in fluid communication with processing chamber 16 via a butterfly valve 67 and pump channel 68. Controller 70 regulates the operations of the various components of system 10. Controller 70 includes a processor 72 in data communication with memory, such as random access memory 74 and a hard disk drive 76 and is in signal communication with pump system 64, temperature control system 52, fluid supply system 69 and various other aspects of the system as required. System 10 may establish conditions in a region 77 of processing chamber 16 located proximate to a surface 78 of a substrate 79 disposed on support pedestal 48 to form desired material thereon, such as a thin film. It should be appreciated that processing chamber 16 is configured to create a peripheral flow channel 71 that surrounds support pedestal 48 when placed in a processing position to provide processing region 77 with the desired dimensions based upon chemical processes to be achieved by system 10. Pump channel 68 is situated in housing 14 so that processing region 77 is positioned between pump channel 68 and showerhead 90.

The dimensions of peripheral flow channel 71 are defined to provide a desired conductance of processing fluids therethrough that provide flows of processing fluids over a surface 78 of substrate 79 in a substantially uniform manner and in an axi-symmetric fashion in one embodiment. In another embodiment, the conductance through pump channel 68 is chosen to be larger than the conductance through peripheral flow channel 71. It should be noted that the processing chamber of FIG. 1A is one exemplary processing chamber and the embodiments for the chamber top assembly described herein may be incorporated into other processing chambers as desired.

Figure 1B:
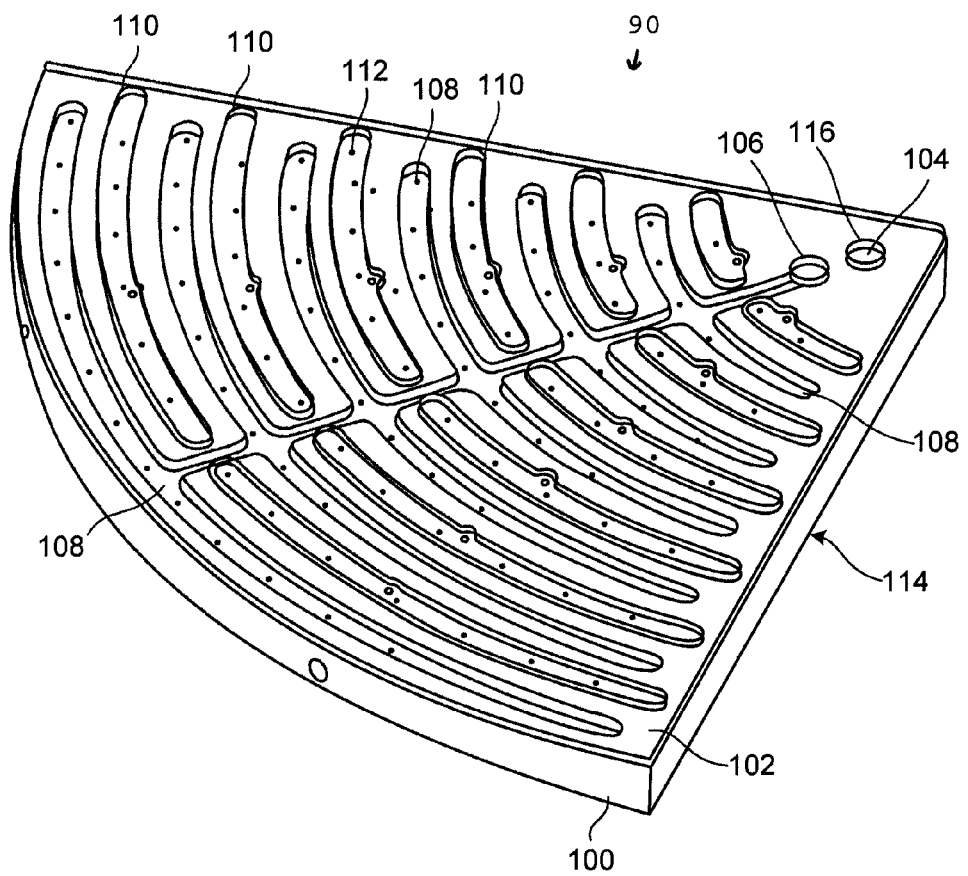
FIG. 1B is an exemplary view of a portion of a showerhead, in accordance with one embodiment of the present invention.

FIG. 1B is an exemplary view of a showerhead portion 101, of the chamber top assembly, in accordance with one embodiment of the present invention. The illustration should not be perceived as inclusive as the showerhead portion 101 may include additional components. For simplicity and clarity, the gas distribution elements of the showerhead portion 101 include a plate 100 and a gasket 102. In the embodiment shown in FIG. 1B the gasket 102 is rendered as translucent so features on the plate 100 are visible. The plate 100 has a distribution face 112 and on an opposing side from the distribution face 112 is a dispensing face 114. Formed on the distribution face 112 is a plurality of channels 108 and an internal inlet 104. Channels 108 are defined periodically at different radial lengths from a center of the showerhead along a depth of the surface of showerhead portion 101. A channel extending radially from a center region of showerhead portion 101 interconnects channels 108.

FIG. 1B shows a quarter of the showerhead portion 101 in this exemplary embodiment. In other embodiments the showerhead portion 101 can be made to be any portion of the showerhead, such as, but not limited to a half, a third, an eighth, etc. Similarly, the circular shape of the portion of the showerhead portion 101 should also not be considered limiting as the showerhead portion 101 can be made to any shape. The multiple portions of the showerhead may be supported through a nesting into which the portions are placed. One skilled in the art will appreciate that known support techniques for the multiple portions may be utilized to support the showerhead portions on a top surface of the chamber and to the back plate of the top assembly discussed in more detail below.

When assembled, the gasket 102 is pressed onto the distribution face 112 and isolates the channels 108 from the gasket network 110. The gasket 102 includes a gasket opening 106 that is aligned with the channel 108 and a gasket opening 116 that is aligned with the internal inlet 104. The gasket 102 further includes a gasket network 110. The gasket network 110 includes a plurality of cutouts through the gasket 102 that are aligned with features on the plate 100. In addition, the cutout shapes for gasket 102 are exemplary. That is, any suitable shape that isolates gasket network 110 from channels 108 is acceptable.

In one exemplary embodiment, the plate 100 is formed from a material such as nickel with a thickness of about 8 millimeters. In other embodiments, the plate 100 is formed from materials such as, but not limited to steels and ceramics with thicknesses within a range of about 4 millimeters to about 12 millimeters. In still other embodiment, the plate 100 is formed from materials that are non-reactive with processing fluids used within the processing system with a thickness that is determined based on the particular process fluids and the required flow rates of the process fluids. It should be appreciated that the showerhead portion of FIG. 1B is one exemplary showerhead and other showerheads may be integrated with the embodiments described herein. Additional information on the details of the showerhead may be found in U.S. application Ser. No. 12/346,195, which is incorporated by reference for all purposes.

The embodiments described below provide further details for a high temperature chamber lid that can be utilized in low temperature processes also. This flexibility is advantageous to the combinatorial processing techniques mentioned above as the substrate being processed may remain in the same processing chamber without having to be transferred to another chamber to perform a different process. That is this multi-purpose single chamber can be used to run multiple high temp and low temp processes. In one embodiment, the high temperature processes are any process that requires a temperature of 500 degrees C. or greater in the showerhead. The composition of the components for the top assembly that are described below include inert, high strength, electrically conductive materials for the shower head at the target application temperature range. Nickel 201, a high strength, relatively good thermal conductivity, inert, corrosive resistant metal is used for the shower head in order to maintain electrical conductivity for a plasma application. The Nickel 201 shower head maintains contact with a nickel chromium based super alloy back plate, such as INCONEL 600, INCONEL 718 or INCONEL 725 which has an embedded heating element. The nickel chromium based super alloy has comparable corrosion resistance to Nickel 201, while having a much higher mechanical strength at higher temperatures, which is suitable for use as a vacuum chamber lid. In the embodiments described below, the back plate forms the sealing plate on the lid of the vacuum chamber, utilizing its high strength property to withstand the pressure differential from atmosphere to vacuum. Furthermore, the low thermal conductivity of the nickel chromium based super alloy reduces heat loss from the heating element to the surrounding lid hardware, thereby also maintaining cooler temperatures for the elastomeric o-ring seal at the sealing interface. The back plate features an annular air-gap above the heating element, to further increase thermal resistance and reduce heat loss to components above the heating element. The heat choke created by the air-gap allows thermal spreading in the shower head, reducing the temperature range across the shower head.

One skilled in the art will appreciate that a vacuum seal is necessary at the interface of the back plate and gas feeds pathways through the top assembly. Due to the very high temperature seen by the back plate, metal seals are utilized, instead of elastomeric seals. However, the elastomeric seals need to be used at the ceramic radio frequency (RF) isolator interfaces that allow the precursor gases to pass through these gas feeds. The embodiments utilize a transition hub made of stainless steel, the nickel chromium based super alloy, or some other suitable material to bridge the metal seal interface to the elastomeric seal interface. The hub is designed to have a minimal contact with the back plate at the seal interface, allowing metal seals to be used, while reducing heat conduction. In one embodiment, the hub is cooled by contact with lid components that are chilled by a cold aluminum vacuum chamber lid. In this embodiment, the vacuum chamber lid is designed to have a cooling channel, having an active coolant flow, which keeps the lid at a low temperature, making the lid a heat sink for chamber lid components. Due to this manner of cooling, relatively low temperatures are achieved near the top of the hub, allowing elastomeric seals to be used at the ceramic to metal interface at the top surface of the hub. Thus, the embodiments enable a high temperature shower head with CVD and PECVD capability, and at the same time the vacuum chamber lid may be chilled by using a low temperature coolant or heat transfer fluid. In one embodiment, GALDEN is used if the coolant temperature is expected to be relatively high, such as the case for the high temperature showerhead applications. In another embodiment, such as for low temperature showerhead applications, a water/ethylene glycol mixture or some other suitable coolant may be utilized.

Figure 2A:
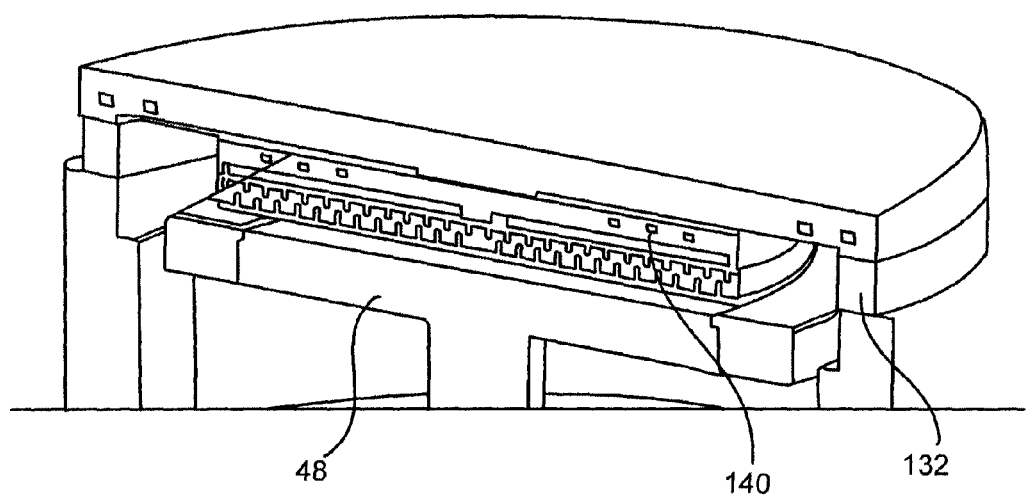
FIG. 2A is a simplified schematic diagram illustrating a cross-sectional view of a back plate and showerhead according to one embodiment of the invention.

FIG. 2A is a simplified schematic diagram illustrating a cross-sectional view of a back plate and showerhead according to one embodiment of the invention. Back plate 120 is disposed over showerhead 90. In one embodiment showerhead 90 is a dual port showerhead as described above with reference to FIG. 1B. Back plate 120 includes cooling channel 150 which is defined within a top portion of back plate 120. In this embodiment, cooling channel 150 is defined around a peripheral region of the top portion of back plate 120. Back plate 120 includes a top portion and a bottom portion joined through a central region. The bottom portion of back plate 120 includes an embedded heating element 140. In one embodiment, heating element 140 is a resistive coil embedded in the lower portion of back plate 120. Heating element 140 may be a single coil that radially extends through the lower portion in one embodiment. In another embodiment, heating element 140 may be multiple independent coils as described further below. Shower head 90 is affixed to a surface of the lower portion of back plate 120. Shower head 90 is spaced apart from and disposed over pedestal 48 to define a processing region. An outer periphery of a lower surface of the upper portion of back plate 120 is affixed to ceramic insulator 132. In one embodiment, the seal between back plate 120 and ceramic insulator 132 is an elastomeric seal that provides a sufficient vacuum seal for the process chamber as mentioned above.

Figure 2B:
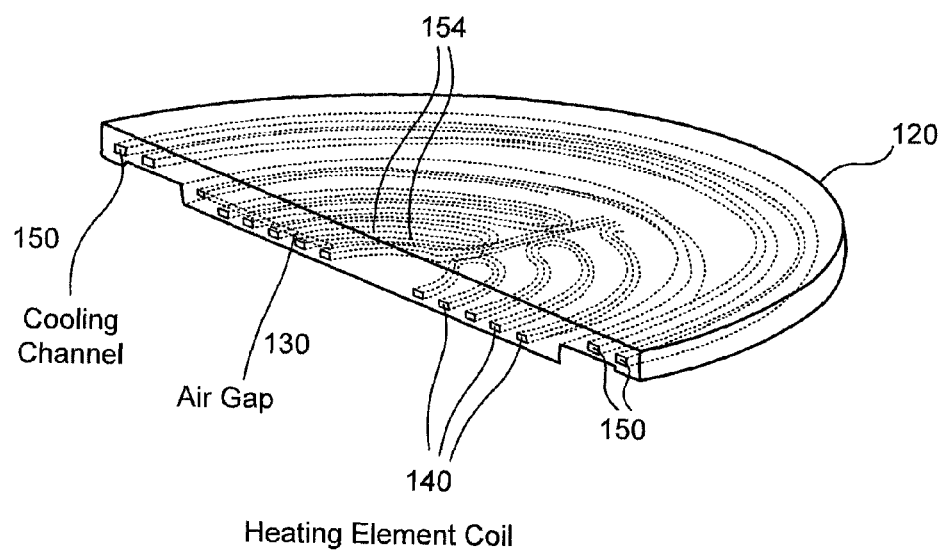
FIG. 2B is a simplified schematic diagram illustrating a cross-sectional view of the back plate in accordance with one embodiment of the invention.

FIG. 2B is a simplified schematic diagram illustrating a cross-sectional view of the back plate in accordance with one embodiment of the invention. Back plate 120 includes a plurality of heating elements 140 radially disposed within a lower portion of the back plate. Along and outer periphery of back plate 120 are cooling channels 150. Air gap 130 is provided as an annular channel around a central region of back plate 120 joining the upper portion and the lower portion of the back plate. One skilled in the art will appreciate that air gap 130 provides an insulative affect to the heat generated by heating elements 140 disposed below air gap 130. Fluid channels 154 extend through the upper portion, the lower portion, and the central region of back plate 120. In one embodiment, fluid channels 154 provide access for process gases and fluids from an external fluid source to the showerhead for a processing operation.

Figure 3A:
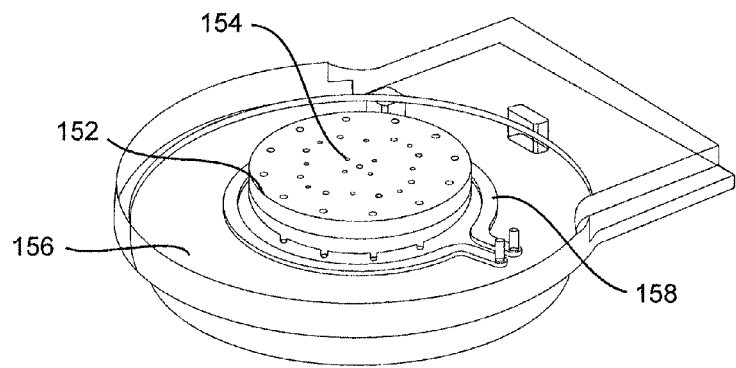
FIG. 3A is a simplified schematic diagram illustrating a perspective view of a chamber top assembly having a hub and lid plate in accordance with one embodiment of the invention.

FIG. 3A is a simplified schematic diagram illustrating a perspective view of a chamber top assembly having a hub and lid plate in accordance with one embodiment of the invention. In the embodiment of FIG. 3A, hub 152 is disposed over a central region of a top surface of the back plate. Lid plate 156 is disposed around the side surfaces of hub 152 and disposed over the remaining portion of exposed surfaces of the top of the back plate. One skilled in the art will appreciate that this configuration can be used in non-RF processes, otherwise, a ceramic isolator is employed as described with reference to FIGS. 5A and 5B. Hub 152 includes a plurality of fluid channels 154 which have an opening on a top surface of the hub and interface with corresponding fluid channels of the back plate. Lid plate 156 includes an annular fluid channel 158 disposed around hub 152 that may be utilized for cooling fluid in one embodiment.

Figure 3B:
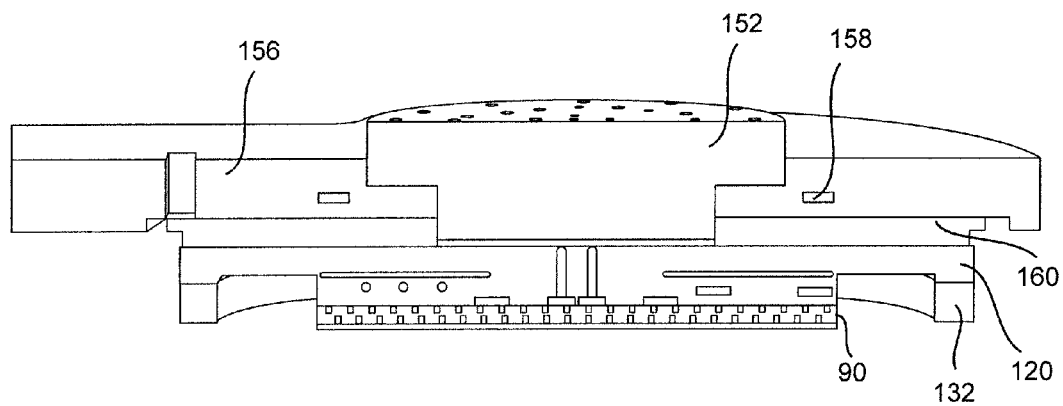
FIG. 3B is a simplified schematic diagram illustrating a cross-sectional view of the hub and lid plate in accordance with one embodiment of the invention.

FIG. 3B is a simplified schematic diagram illustrating a cross-sectional view of the hub and lid plate in accordance with one embodiment of the invention. Hub 152 is disposed above a top surface of a top portion of back plate 120. Lid plate 156 is disposed around the side surfaces of hub 152 and above ceramic isolator 160. Ceramic isolator 160 is disposed above the remaining exposed top surface of the top portion of back plate 120. One skilled in the art will appreciate that hub 152 and back plate 120 are electrically isolated from lid plate 156 in one embodiment, as the chamber may be used for RF processing operations. Annular cooling channel 158 is disposed within lid plate 156 and surrounds a side surface of hub 152 in one embodiment. Back plate 120 seals with ceramic insulator 132. Showerhead 90 is disposed over a bottom surface of back plate 120. Exemplary materials utilized for the components described herein include stainless steel or a nickel chromium based super alloy for hub 152, aluminum for lid plate 156, a nickel-chromium super alloy for back plate 120 and nickel for showerhead 90. It should be appreciated that these materials are exemplary and not meant to be limiting as alternative materials may be employed with the embodiments described herein.

Figure 4A:
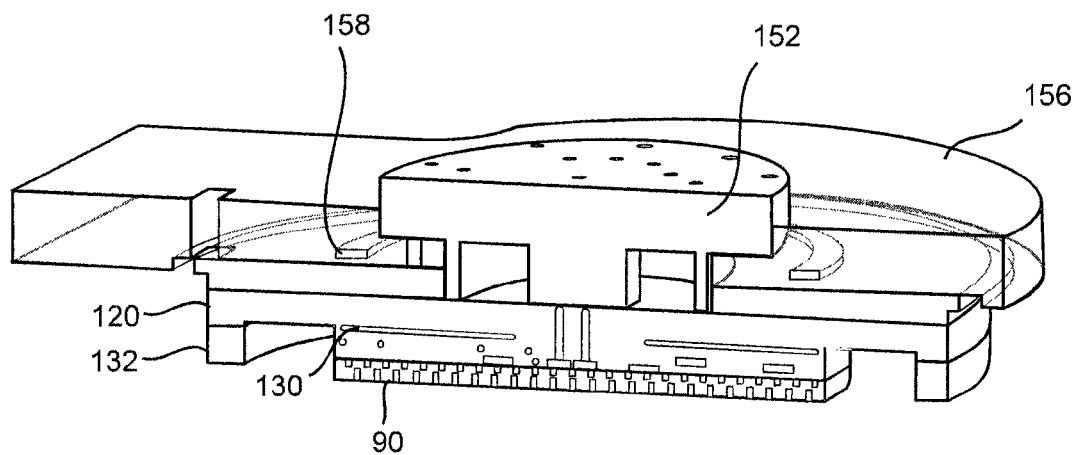
FIG. 4A is a simplified schematic diagram illustrating a cross-sectional view of a chamber top assembly having a minimal contact hub in accordance with one embodiment of the invention.

FIG. 4A is a simplified schematic diagram illustrating a cross-sectional view of a chamber top assembly having a minimal contact hub in accordance with one embodiment of the invention. Hub 152 is disposed over back plate 120. The cross-sectional view of hub 152 illustrates a substantially flat top surface of the hub and a central extension extending from a bottom surface of the hub along with a spaced apart annular extension also extending from the bottom surface of the hub. Lid plate 156 has an annular cooling channel 158 defined therethrough. Showerhead 90 is affixed to a bottom surface of back plate 120, which includes air gap 130.

Figure 4B:
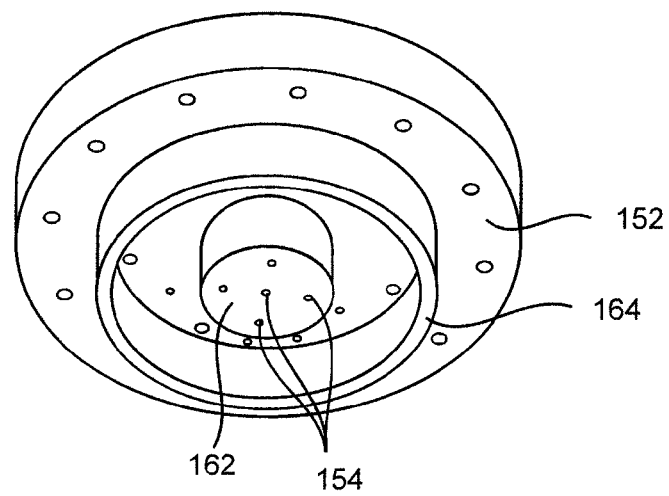
FIG. 4B is a simplified schematic diagram illustrating a perspective bottom view of the hub in accordance with one embodiment of the invention.

FIG. 4B is a simplified schematic diagram illustrating a perspective bottom view of the hub in accordance with one embodiment of the invention. In this embodiment the bottom surface of the minimal contact hub 152 includes a central extension 162 and an annular extension 164. A plurality of fluid channels 154 extend through a central region of the hub from a top surface to a bottom surface of the central extension. Annular extension 164 is spaced apart from an outer side surface of central extension 162. It should be appreciated that in this embodiment an annular cavity is defined between the central extension 162 and annular extension 164. This cavity has an insulative affect on the heat being generated through back plate 120.

Figure 5A:
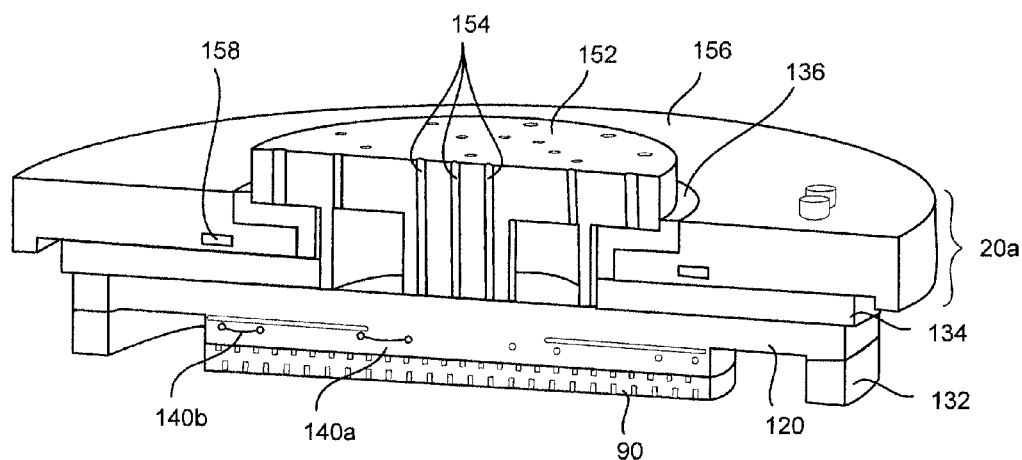
FIG. 5A is a simplified schematic diagram of a cross-sectional view of a top assembly for a processing chamber having dual zone back plate heater with a minimal contact hub in accordance with one embodiment of the invention.

FIG. 5A is a simplified schematic diagram of a cross-sectional view of a top assembly for a processing chamber having dual zone back plate heater with a minimal contact hub in accordance with one embodiment of the invention. Hub 152 includes a plurality of fluid channels 154 extending through the hub. It should be appreciated that fluid channels 154 mate with corresponding openings on back plate 120, to provide process fluids to showerhead 90. Lid assembly 20a includes lid plate 156 and is coupled to a side surface of hub 152 and a top surface of back plate 120 through ceramic insulators 136 and 134, respectively. Thus, lid plate 156 is electrically isolated from hub 152 and back plate 120. In this embodiment, back plate 120 includes a dual zone heater. A first zone includes heating element 140a, while a second zone includes heating element 140b. The first zone is defined partially within the central region of back plate 120 that joins the upper portion and lower portions of the back plate. The second zone is defined around an outer peripheral region of the lower portion of back plate 120. The zones may be moved within the back plate as the zone locations of FIG. 5A are exemplary locations.

Figure 5B:
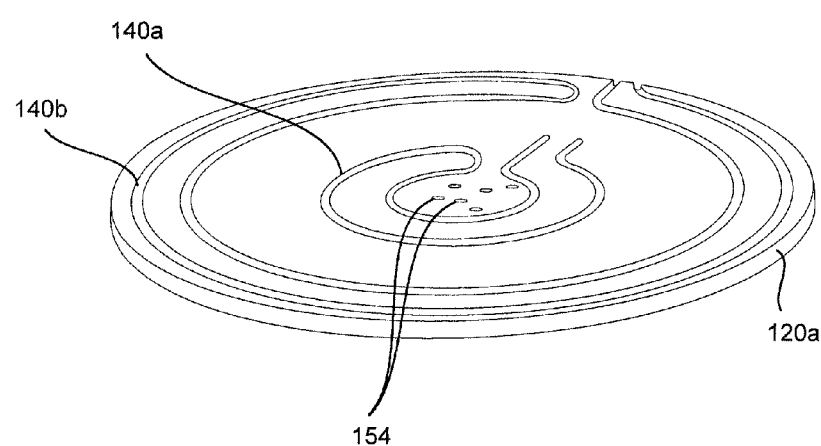
FIG. 5B is a simplified schematic diagram illustrating a cross-sectional view of the dual zone back plate heater in accordance with one embodiment of the invention.
Figure 6:
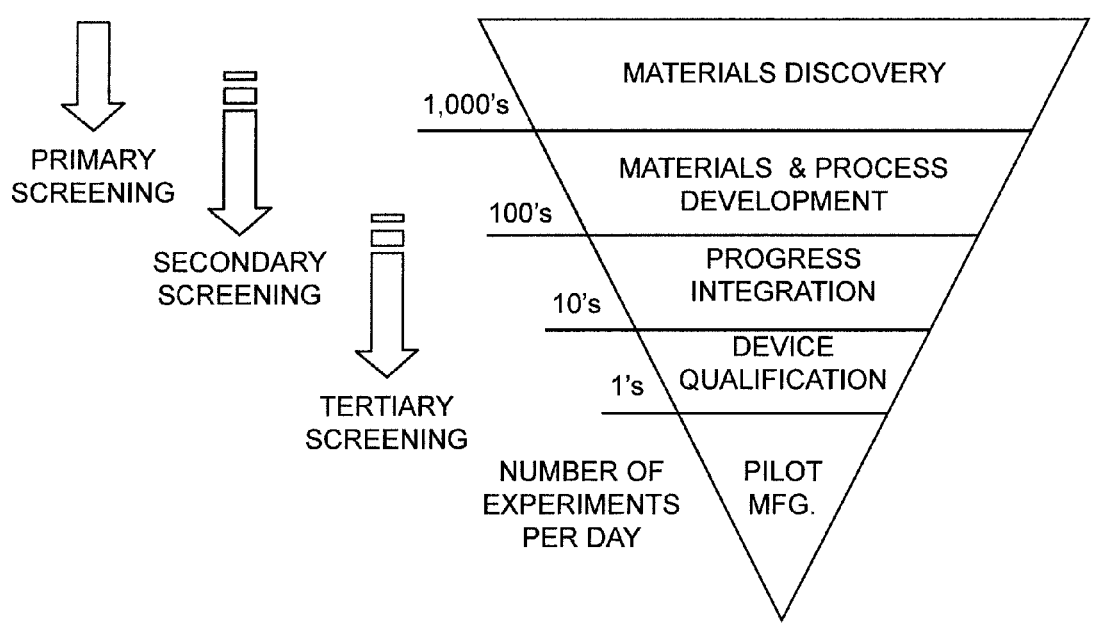
FIG. 6 is a simplified schematic diagram illustrating an overview of the High-Productivity Combinatorial (HPC) screening process for use in evaluating materials, unit processes, and process sequences for the manufacturing of semiconductor devices in accordance with on embodiment of the invention.

FIG. 5B is a simplified schematic diagram illustrating a cross-sectional view of the dual zone back plate heater in accordance with one embodiment of the invention. Lower portion 128 of the back plate includes heating element 140a embedded within a first region and heating element 140b embedded within a second region of the lower portion of the back plate. Heating element 140a is defined within a central region of the back plate. Heating element 140b is defined along an outer periphery of the lower portion 120a of the back plate. Fluid channels 154 extend through the lower portion 120a of the back plate and are encompassed by heating element 140a. In another embodiment, fluid channels 154 are disposed between the heating elements 140a and 140b, i.e., in between the first and second regions defined by heating elements. In addition, fluid channels 154 extend in a plane that is orthogonal to the plane of the heating elements in one embodiment. One skilled in the art will appreciate that the power supply for the resistive heating elements 140a and 140b are supplied through insulated conduits that proceed from back plate 120 through ceramic insulator 134 and through lid plate 156 to a power source. In addition, it should be noted that the separate heating elements 148 and 140 be can be independently controlled to provide different power densities in the corresponding zones. In one exemplary embodiment, the sheath power density supplied by heating element 140a is about 60 watts/in$^2$, and the power density supplied by heating element 140b is about 40 watts/in$^2$. It should be appreciated that the dual heating zone configuration in the back plate offsets the cold spot at the center of the back plate due to the cooling hub. By having an independent heating zone near the center of the back plate and another at the edge, an offset in the watt densities can be applied between the 2 zones to reduce the center cold spot and improve the temperature range across the shower head. In one embodiment, the vacuum chamber lid can be chilled even further by using a low temperature coolant and tuning of the dual zone heating elements to maintain a low temperature across the shower head. Thus, the embodiments remove restrictions on selection of a precursor e.g., as may be the case with some processes employing Titanium tetrachloride. In addition, the embodiments provide flexibility of control over shower head temperature to prevent premature reactions from occurring upstream of the wafer substrate. The embodiments allow many different precursor to be tested through the same chamber top assembly, thereby minimizing chamber and process development cost FIG. 6 is a simplified schematic diagram illustrating an overview of the High-Productivity Combinatorial (HPC) screening process for use in evaluating materials, unit processes, and process sequences for the manufacturing of semiconductor devices in accordance with on embodiment of the invention. The materials utilized for the deposition process include materials that are highly reactive and need to be segregated prior to the entrance into the deposition chamber. In one embodiment, the deposition processes may be utilized for graphene processes. In another embodiment, the chamber design may be incorporated with the use of Titanium tetrachloride ($TiCl_4$), e.g., where the $TiCl_4$ is a precursor in the deposition process. Thus, the chamber lid/showerhead described herein may be employed with these processes, as well as any other process, so that the showerhead temperature is maintained substantially uniform for high temperature or low temperature processes. As illustrated in FIG. 6, primary screening incorporates and focuses on materials discovery in one embodiment. Here, the materials may be screened for certain properties in order to select a subset of possible candidates for a secondary level of screening, which will look at materials and unit processes development and process integration. Thereafter, tertiary screening further narrows these candidates through process integration and device qualification in order to identify possible optimizations in terms of materials, unit processes and process sequence integration.

The time required to perform this type of screening will vary, however, the efficiencies gained through the HPC methods provide a much faster development system than any conventional technique or scheme. While these stages are defined as primary second and tertiary, these are arbitrary labels placed on these steps. Furthermore, primary screening is not necessarily limited to materials research and can be focused on unit processes or process sequences, but generally involves a simpler substrate, less steps and quicker testing than the later screening levels.

The stages also may overlap and there may be feedback from the secondary to the primary, and the tertiary to the secondary and/or the primary to further optimize the selection of materials, unit processes and process sequences. In this manner, the secondary screening begins while primary screening is still being completed, and/or while additional primary screening candidates are generated, and tertiary screening can begin once a reasonable set of options are identified from the secondary screening. Thus, the screening operations can be pipelined in one embodiment. As a general matter and as discussed elsewhere in more detail, the level of sophistication of the structures, process sequences, and testing increases with each level of screening. Furthermore, once the set of materials, unit processes and process sequences are identified through tertiary screening, they must be integrated into the overall manufacturing process and qualified for production, which can be viewed as quaternary screening or production qualification. In one more level of abstraction, a wafer can be pulled from the production process, combinatorially processed, and returned to the production process under tertiary and/or quaternary screening.

It should be appreciated that the embodiments described herein provide for a showerhead that isolates a plurality of fluids from each other while flowing into a deposition chamber. In the embodiments described above, reactive gases utilized for the deposition of films on a substrate proceed through the showerhead through separate pathways. A mating gasket provides the means for isolating the plurality of flows in one embodiment. Thus, the embodiments support a combinatorial process providing partitioned deposition in one embodiment. In another embodiment, the lack of large volumes within the distribution pathway permits quick purging, helping to make fast transitions from reactant rich gas stream to an inert gas stream. One skilled in the art will appreciate that the patterns of holes on the showerhead may be interlaced as described above or distributed differently to evaluate different distribution patterns on a combinatorially processed substrate. In addition, the exemplary thicknesses, diameters, and materials of construction listed herein are not meant to be limiting. That is, the dimensions are provided for illustrative and exemplary purposes and may vary based on the application for which the showerhead is being utilized.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A top assembly for a processing chamber, comprising:
a back plate having a bottom portion and a top portion, the bottom portion connected to the top portion through a central region of the back plate, wherein a gap is defined between opposing surfaces of the bottom and top portions outside the central region, and wherein the bottom portion includes an embedded heating element; and
a hub affixed to a top surface of the top portion of the back plate over the central region, the hub having a top surface with a plurality of channel openings defined within a central region of the hub and a bottom surface having a central extension with a plurality of channels defined therethrough.

2. The top assembly of claim 1, further comprising:
a lid assembly extending from an outer surface of the hub.

3. The top assembly of claim 2, wherein the lid assembly includes a conductive lid portion and an insulative portion electrically isolating the conductive lid portion from the back plate and the hub.

4. The top assembly of claim 2, wherein the lid assembly includes an annular fluid channel extending around and spaced apart from the annular extension.

5. The top assembly of claim 1, wherein the embedded heating element is a resistive heating element.

6. The top assembly of claim 1, wherein the embedded heating element includes a first resistive heating element defined under the central region and a second resistive heating element defined outside the central region.

7. The top assembly of claim 1, wherein the top assembly is disposed over a showerhead, and wherein the back plate is composed of a nickel-chromium alloy and the hub is composed of one of stainless steel or the nickel-chromium alloy.

8. A semiconductor processing chamber, comprising:
a top assembly including,
a back plate having a bottom portion and a top portion, the bottom portion connected to the top portion through a central region of the back plate, wherein an annular gap around the central region is defined between opposing surfaces of the bottom and top portions;
wherein the bottom portion includes an embedded heating element;
a hub affixed to a top surface of the bottom portion of the back plate, the hub having a substantially flat top surface and a bottom surface having a central extension, wherein a diameter of the hub is less than a diameter of the back plate; and
a showerhead affixed to a bottom surface of the top portion of the back plate, wherein fluid channels extend from the top surface of the hub through the central extension to corresponding fluid channels defined through the bottom portion, the top portion and the central region of the back plate.

9. The chamber of claim 8, further comprising:
a lid assembly disposed over the top surface of the bottom portion of the back plate, the lid assembly including a conductive lid portion electrically isolated from the hub and the back plate.

10. The chamber of claim 9, wherein the lid portion includes an annular fluid channel extending around and spaced apart from the hub.

11. The chamber of claim 8, wherein an interface of the fluid channels between the hub and the back plate is sealed with metal seals and wherein an interface of the fluid channels between the top surface of the hub and a fluid source are elastomeric seals.

12. The chamber of claim 8, wherein the showerhead includes multiple radial sections, each of the sections having a first inlet and a second inlet, the first inlet being a recess on a top surface of the corresponding radial section, the second inlet being an opening partially extending into a depth of the corresponding radial section and wherein the hub includes an annular extension spaced apart from the central extension.

13. A semiconductor processing chamber, comprising:
a top assembly including,
a back plate having a bottom portion and a top portion, the bottom portion connected to the top portion through a central region of the back plate, wherein an annular gap around the central region is defined between opposing surfaces of the bottom and top portions;
wherein the bottom portion includes an embedded heating element;
a hub affixed to a top surface of the bottom portion of the back plate, the hub having a substantially flat top surface and a bottom surface having a central extension, wherein a diameter of the hub is less than a diameter of the back plate; and
a showerhead affixed to a bottom surface of the top portion of the back plate, wherein fluid channels extend from the top surface of the hub through the central extension to corresponding fluid channels defined through the bottom portion, the top portion and the central region of the back plate
wherein the embedded heating element includes a first resistive heating element defined at least partially within the central region and a second resistive heating element defined along an outer periphery of the top portion of the back plate and below the annular gap.

14. The chamber of claim 13, wherein the first resistive heating element and the second resistive heating element are independently controlled.

15. The top assembly of claim 13, further comprising:
a lid assembly extending from an outer surface of the hub.

* * * * *